United States Patent

Yoshikazu

[11] Patent Number: 5,989,982
[45] Date of Patent: Nov. 23, 1999

[54] SEMICONDUCTOR DEVICE AND METHOD OF MANUFACTURING THE SAME

[75] Inventor: Takahashi Yoshikazu, Tokyo, Japan

[73] Assignee: Oki Electric Industry Co., Ltd., Tokyo, Japan

[21] Appl. No.: 08/967,022

[22] Filed: Nov. 10, 1997

[30] Foreign Application Priority Data

Oct. 8, 1997 [JP] Japan .................................. 9-275964

[51] Int. Cl.⁶ .................................................. H01L 21/301
[52] U.S. Cl. ........................ 438/462; 438/113; 438/460; 438/464
[58] Field of Search ........................... 438/113, 114, 438/458, 459, 460, 462, 464, 465

[56] References Cited

U.S. PATENT DOCUMENTS

| | | | |
|---|---|---|---|
| 5,547,906 | 8/1996 | Badehi | 438/465 |
| 5,604,160 | 2/1997 | Warfield | 438/113 |
| 5,776,798 | 7/1998 | Quan et al. | 438/460 |
| 5,879,964 | 3/1999 | Pair et al. | 438/113 |
| 5,897,337 | 4/1999 | Kata et al. | 438/460 |

FOREIGN PATENT DOCUMENTS 8-306853  11/1996  Japan .
9-64049   3/1997   Japan .

*Primary Examiner*—Kevin M. Picardat
*Attorney, Agent, or Firm*—Jones Volentine, LLP

[57] ABSTRACT

Disclosed herein is a method of manufacturing a semiconductor device, according to the present invention, wherein a wafer is divided into individual fractions by a diamond blade, the entire surface of the wafer, which include gaps between the respective fractions, is thereafter sealed with a resin, and the wafer is divided into individual fractions again by a diamond blade narrower than another diamond blade in width, whereby a chip size package in which the resin is being left on one sides of a chip, can be obtained. According to the method referred to above, a chip size package in which chip sides are also sealed with the resin, can be easily manufactured.

11 Claims, 5 Drawing Sheets

SEMICONDUCTOR DEVICE AND METHOD OF MANUFACTURING THE SAME

BACKGROUND OF THE INVENTION

1. Field of the Invention

This invention relates to a resin-sealed semiconductor element, and particularly to a chip size package substantially identical in size to an LSI chip.

2. Description of the Related Art

As a technique employed in this field, there has heretofore been one wherein leads are formed on a semiconductor element, bumps are formed on portions of the leads respectively and the semiconductor element is resin sealed or molded in a state in which the back or reverse side thereof is being exposed. This type of technique has been disclosed in Japanese Patent Application Laid-Open No. 8-306853.

SUMMARY OF THE INVENTION

An object of the present invention is to provide a method of manufacturing a chip size package capable of being accurately divided into individual chips when it is divided into the chips.

Another object of the present invention is to provide a method capable of easily manufacturing a chip size package in which the surface and sides of a chip are covered with a resin.

According to one aspect of the present invention, for achieving the above objects, there is provided a semiconductor device comprising:

a semiconductor element having electrodes protruding from the surface thereof;

a sealing resin for covering the surface of the semiconductor element and sides thereof; and ball electrodes connected to the electrodes exposed from the sealing resin.

According to another aspect of the present invention, there is provided a method of manufacturing a semiconductor device, comprising the following steps:

a step for forming protruded electrodes in a plurality of element regions of a wafer having the plurality of element regions formed on the surface thereof;

a step for forming a sealing resin having concave portions provided on the wafer surface, the concave portions defining boundaries among the plurality of element regions, in a state in which surfaces of the protruded electrodes are being exposed;

a step for forming ball electrodes on the protruded electrodes exposed from the sealing resin respectively; and a step for dividing the plurality of element regions into individual elements with the concave portions as standards.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features and advantages thereof will be better understood from the following description taken in connection with the accompanying drawings in which:

FIGS. 6(a)–6(h) are a view showing a third embodiment showing a manufacturing method of the present invention.

DETAILED DESCRIPTION OF THE PREFERRED EMBODIMENTS

Figure 1:
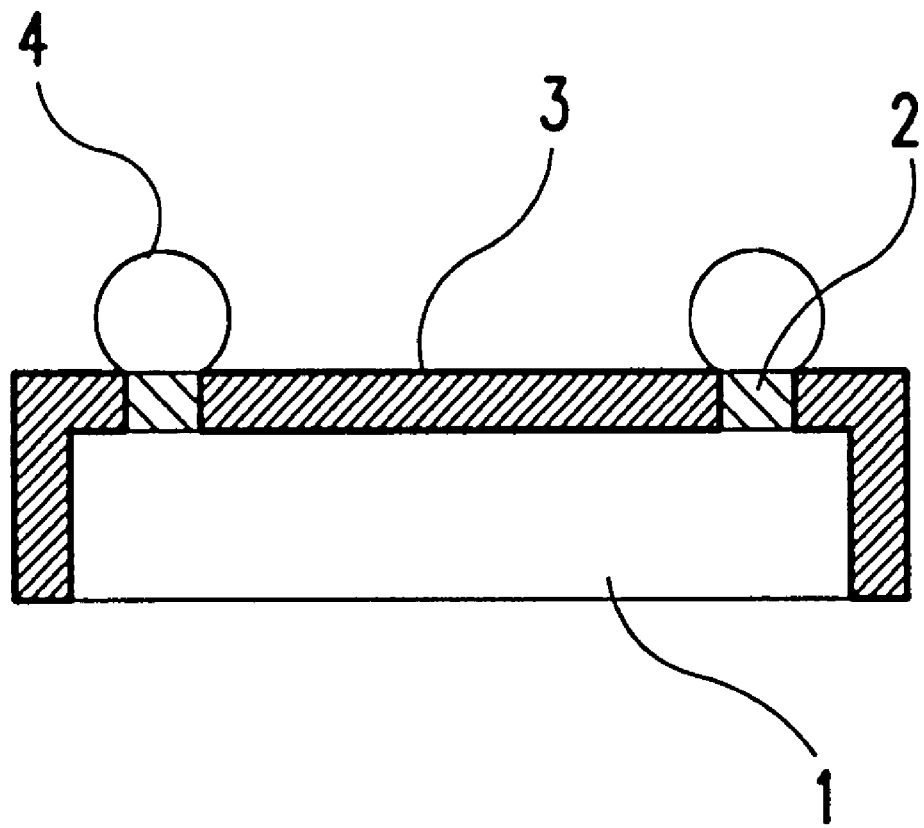
FIG. 1 is a cross-sectional view of a chip showing a first embodiment of the present invention.

Preferred embodiments of the present invention will hereinafter be described with reference to the accompanying drawings. FIG. 1 is a cross-sectional view for describing a first embodiment of the present invention. Reference numeral 1 indicates an LSI chip. Reference numerals 2 indicate bump electrodes each formed of a gold plate or the like whose one side ranges from about 50 $\mu$m to 100 $\mu$m and whose height is about 15 $\mu$m. Reference numeral 3 indicates an epoxy resin which is used for the protection of the surface of the LSI chip 1 and covers the surface and sides of the LSI chip 1. Further, the surface of the epoxy resin 3 is the same height as the surface of each bump electrode 2. Reference numerals 4 indicate solder balls used for providing electrical connections to an external substrate and each shaped in the form of a sphere whose diameter ranges from about 300 $\mu$m to 500 $\mu$m The first embodiment showing a method of manufacturing such a semiconductor device or element will now be described with reference to FIGS. 2(a) through 2(h).

Figure 2A:
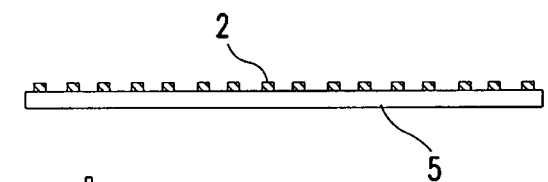
FIGS. 2(a)–(2h) are a manufacturing process chart of a first embodiment showing a manufacturing method of the present invention.

First, bump electrodes 2 are formed on an unillustrated aluminum electrode on a wafer 5 having circuit elements formed thereon, by gold plating or the like as shown in FIG. 2(a). With respect to the dimensions of each bump electrode 2, one side thereof is defined so as to range from about 50 $\mu$m to 100 $\mu$m and the height thereof is defined as about 15 $\mu$m.

Figure 2B:
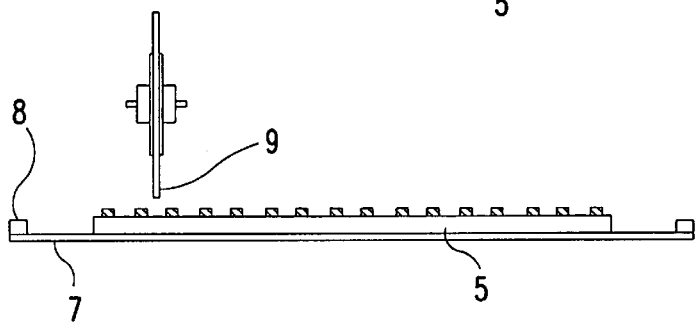

As shown in FIG. 2(b), the reverse side or back of the wafer 5 is applied on a scribe ring 8 through the use of a scribe sheet 7 and the wafer 5 is divided into pieces or fractions with a diamond blade 9 or the like as shown in FIG. 2(c). The width of the diamond blade 9 makes use of about 60 $\mu$m.

Figure 2D:
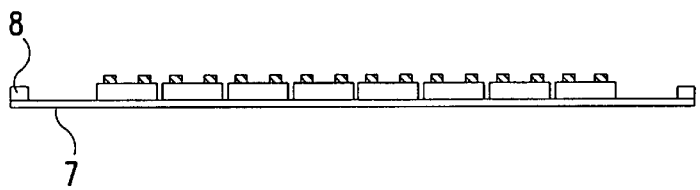
Figure 2E:
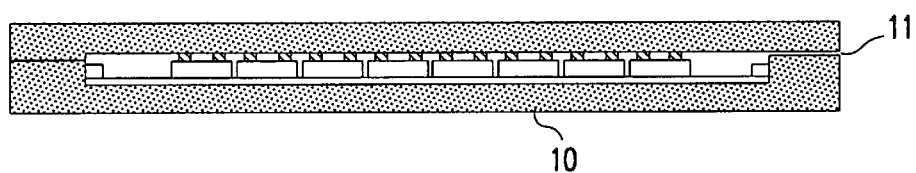

Next, as shown in FIG. 2(d), the wafer 5, which has already been divided into the fractions supported by the scribe sheet 7, is inserted into a molding die 10 together with the scribe ring 8 and the scribe sheet 7. When the wafer 5 is interposed between upper and lower dies, the upper die is held down under a pressure of about 50 gf per bump and pressed under a molding temperature of about 180° C., whereby the heights of the surfaces of the bump electrodes 2 are aligned or made uniform. Thereafter, a resin 12 is injected through a gate 11. FIG. 2(e) shows the state of removal of the molding die 10 after the injection of the resin 12 through the gate 11 in FIG. 2(d). As shown in the same drawing, the resin 12 is formed in a state in which the upper surfaces of the bump electrodes 2 are being exposed.

Figure 2F:
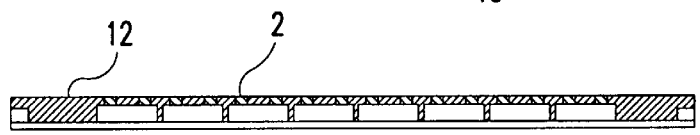
Figure 2G:
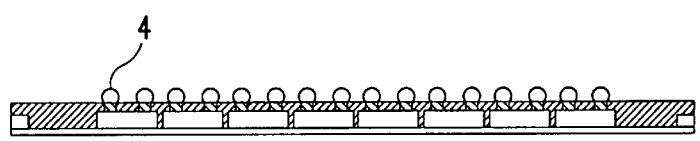
Figure 2G:
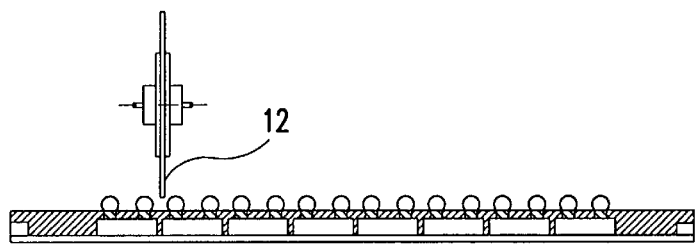
Figure 2H:
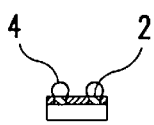

Thereafter, the solder balls 4 are mounted or placed on the surfaces of the bump electrodes 2 respectively as shown in FIG. 2(f). A method of placing the bump balls 4 thereon is as follows: Flux is applied on the bump electrodes 2 and the solder balls 4 are placed thereon and thereafter heated to 200° C. to 250° C. so as to join the solder balls 4 to the bump electrodes 2, whereby the solder balls 4 can be mounted on the surfaces of the bump electrodes 2. After the placement of the solder balls 4 on the bump electrodes 2, the wafer 5 having the divided gaps filled with the resin is divided into individual chips again by a diamond blade 14 or the like as shown in FIG. 2(g). As a result, each chip size package in which the sides of the LSI chip 1 have been also covered with the resin, can be obtained as shown in FIG. 2(h). Here, the width of the diamond blade 14 is about 40 μm. Since one smaller in width than the diamond blade 9 is used, the wafer 5 can be easily divided into the individual chips in a state in which the resin has been left on the sides of the LSI chip 1.

If the width of the diamond blade 9 is set to about twice the width of the diamond blade 14 shown in FIG. 2(g) in FIG. 2 (b), it is then possible to sufficiently ensure the thickness of the resin on each side of the LSI chip 1 shown in FIG. 2(h) and obtain high resistance to the peeling of the resin applied to the sides.

A second embodiment showing a manufacturing method according to the invention of the present application will next be described with reference to FIGS. 3(a) through 3(h). Components corresponding to those shown in FIG. 2 are identified by the same reference numerals and their detailed description will be omitted.

In the second embodiment, bump electrodes 2 are first formed on an unillustrated aluminum electrode on a wafer 5 with circuit elements formed thereon, with gold plating or the like.

Next, the wafer 5 is divided into pieces or fractions through the use of a diamond blade 14 as shown in FIG. 3 (b). As the diamond blade 14 used in the present embodiment, one slender in width, which is shown in FIG. 2(g) in the first embodiment, is used.

Figure 3A:
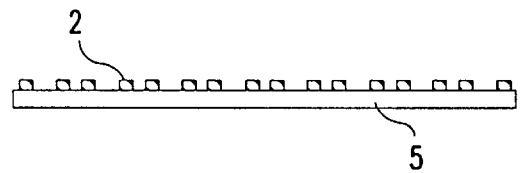
FIGS. 3(a)–(3h) are a manufacturing process chart of a second embodiment illustrating a manufacturing method of the present invention.
Figure 3B:
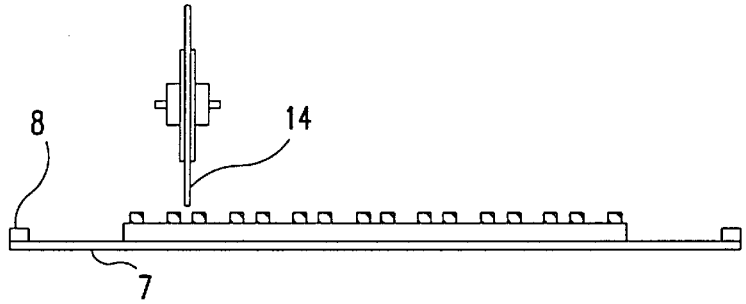
Figure 3C:
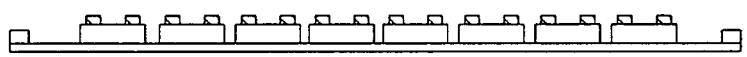
Figure 3D:
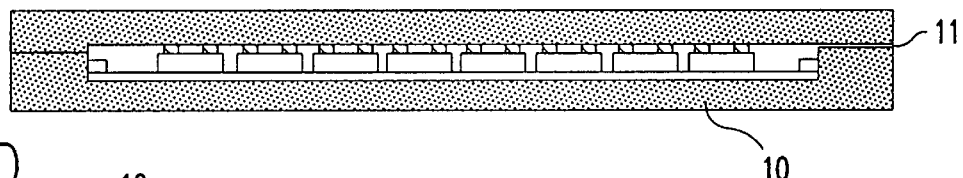
Figure 3E:
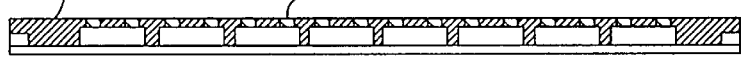

Next, a scribe sheet 7 is elongated so as to open up or extend the space or interval between the adjacent wafers divided into the fractions, as shown in FIG. 3(c). Here, the interval between the wafers is regarded as about 100 μm.

Next, the entire surfaces of LSI chips, which include gaps or spaces between the respective LSI chips, are sealed with resin by using a die 10 in a manner similar to the first embodiment.

Figure 3F:
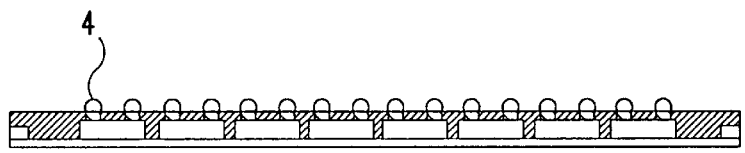

Next, solder balls 4 are placed on their corresponding bump electrodes 2 as shown in FIG. 3(f).

Figure 3G:
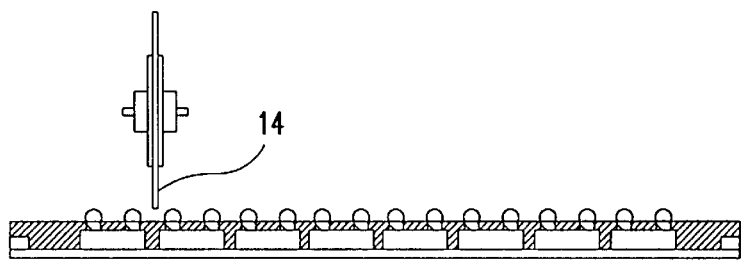
Figure 3H:
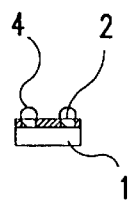

After the placement of the solder balls 4 on the bump electrodes 2, the diamond blade 14 is used to divide between the adjacent LSI chips whose gaps have been filled with the resin, again as shown in FIG. 3(g). Thus, a chip size package in which the sides of the LSI chip 1 have been also covered with the resin as shown in FIG. 3(h), can be obtained.

According to the manufacturing method illustrated in the second embodiment, since the width of the diamond blade can be made thin upon first division of the wafer, portions to be cut by the diamond blade are reduced and the number of chips to be taken out within the wafer increases. Further, since the same diamond blade can be used in two dividing processes, a manufacturing device can be simplified.

Figure 4:
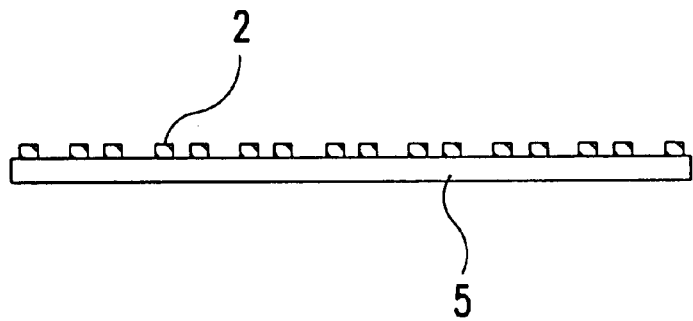
FIG. 4 is a view showing a modification of the second embodiment illustrating the manufacturing method of the present invention.

In the aforementioned manufacturing method, stud bump electrodes 2' may be formed on their corresponding unillustrated electrode pads of a semiconductor wafer 5 in accordance with a wire boding method as shown in FIG. 4. In this case, the need for creating a photolitho mask according to the type of wafer is eliminated and member costs can be reduced. In general, a large amount of facility investments are needed when bumps are formed by a photolitho plating method. However, since a wire bonder will suffice for a stud bump method, the equipment employed in the conventional process can be used and facility costs can be also reduced.

Figure 5:
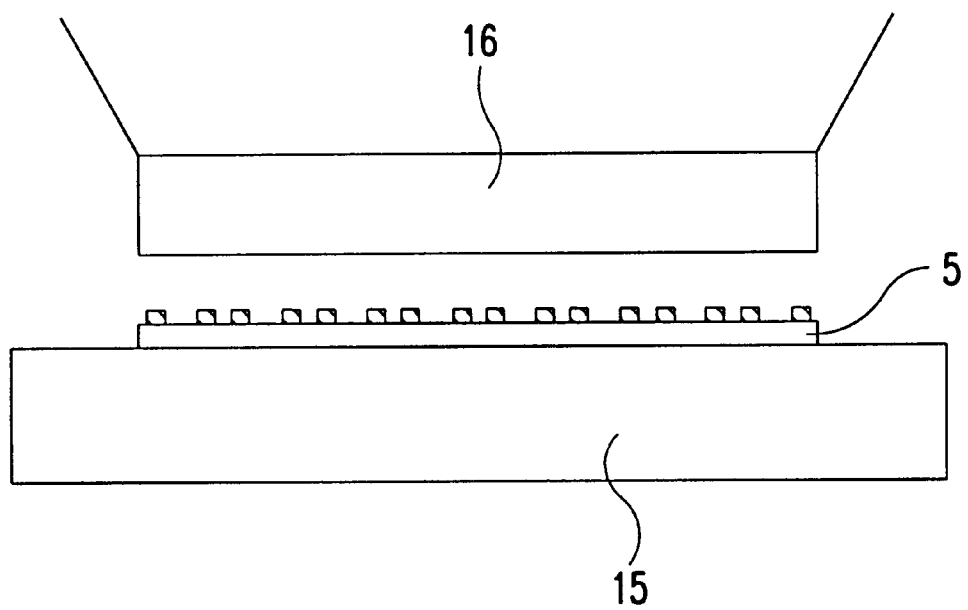
FIG. 5 is a view illustrating anther modification of the second embodiment depicting the manufacturing method of the present invention.

As shown in FIG. 5, the heights of the surfaces of bump electrodes 2 or stud bump electrodes 2' on a semiconductor wafer 5 may be aligned or made uniform by a tool 16. In this case, the semiconductor wafer 5 is placed on a stage 15 and the tool 16 is pressed against the bump electrodes under the condition that the temperature is about 100° C. and the load is about 50 gf bump. Thus, when the surface heights of the bump electrodes are made uniform by the tool 16, the bump electrodes can be suitably made uniform in height even if the wafer to be processed varies in thickness.

Further, the resin may be formed on the reverse sides of the LSI chips divided into fraction form. The resin is applied on the reverse sides after the LSI chip has been divided into fraction form again. Alternatively, each chip is formed by applying the resin on the back of the wafer in accordance with a spin coat method after the bump electrodes 2 have been formed on the wafer 5 with circuit elements formed thereon. In this case, a chip size package capable of preventing flaws from being produced on the back of each chip and providing high reliability can be provided.

A third embodiment showing a manufacturing method according to the present invention will next be described with reference to FIGS. 6(a) through 6(f). Components associated with those shown in FIGS. 2 and 3 are identified by like reference numerals and their detailed description will be omitted.

Figure 6A:
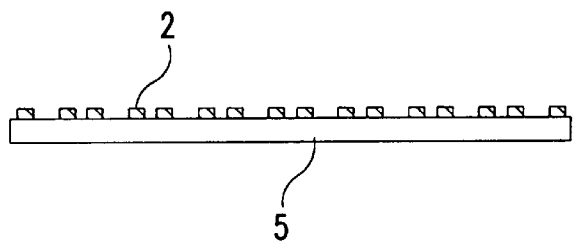

As shown in FIG. 6(a), bump electrodes 2 are formed on an unillustrated aluminum electrode on a wafer 5 having circuit elements formed thereon, by gold plating or the like. With respect to the dimensions of each bump electrode 2, one side thereof is defined so as to range from about 50 μm to 100 μm and the height thereof is defined as about 15 μm.

Figure 6B:
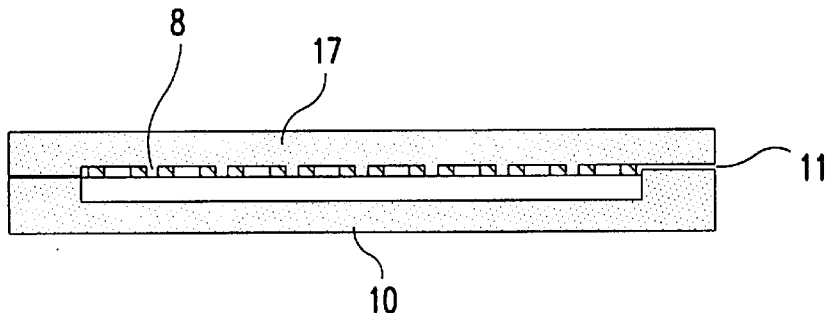

Next, the wafer 5 having the bump electrodes formed thereon is inserted into a die as shown in FIG. 6(b). When the wafer 5 is interposed between upper and lower dies, the upper die is held down under a pressure of about 50 gf per bump and pressed under amolding temperature of about 180° C., whereby the surfaces of the bump electrodes 2 are made uniform in height. Protrusions 18 are provided on the surface of the upper die 17 at their corresponding positions when the wafer 5 is divided into fractional chips. Thereafter, the resin is injected between the upper and lower dies through a gate 11.

Figure 6C:

As shown in FIG. 6(c), concave portions 19 are respectively defined in positions where the so-injected resin 12 is divided into fraction form and corresponding to the protrusions 18 of the upper die 17.

Figure 6D:
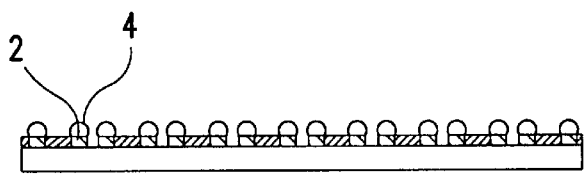

Next, solder balls 4 are placed on their corresponding upper surfaces of the bump electrodes 2 as shown in FIG. 6(d).

Figure 6E:
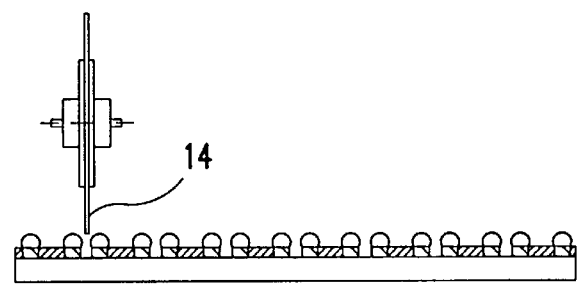
Figure 6F:

Next, as shown in FIG. 6(e), the wafer 5 is divided into individual chips by a diamond blade 14 with the concave portions 19 defined in the surface of the resin 12 as marks. As a result, a chip size package shown in FIG. 6(f) is obtained.

According to the third embodiment, since the concave portions are normally provided at the divided positions of opaque resin 12, they serve as marks upon cutting the wafer into the individual chips, whereby the efficiency of work is improved. Further, since the resin is cut along the concave portions, the thickness of the resin to be cut becomes thin and the amount of wastage of the diamond blade 14 can be also reduced.

In the process step shown in FIG. 6(*b*) referred to above, the resin may be injected into a die having escape portions spaced by predetermined intervals from the surfaces of the bump electrodes 2 and convex portions extending to the neighborhood of the surface of the wafer 5. Since, in this case, no bump electrodes are exposed from the sealed resin formed on the wafer 5, they are made bare by polishing or the like. In doing so, die or mold clearances can be designed with margins and the manufacturing cost of a mold can be reduced. Further, even if the thickness of each wafer to be processed and the height of each bump electrode varies more or less, they can be accommodated.

Although gold is used as the material for the bump electrodes in the individual embodiments referred to above, solder may be used as an alternative. When the solder is used, it is compatible with solder balls formed subsequent to its use, so that the strength of adhesion to the solder balls is improved. Since the solder is low in cost, material costs can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising the steps of:

forming protruded electrodes in a plurality of element regions of a wafer having said plurality of element regions formed on the surface thereof;

forming a sealing resin having concave portions provided on said wafer surface, said concave portions defining boundaries among said plurality of element regions, in a state in which surfaces of said protruded electrodes are being exposed;

forming ball electrodes on the protruded electrodes exposed from said sealing resin respectively; and dividing said plurality of element regions into individual elements with said concave portions as standards.

2. A method according to claim 1, wherein the surfaces of said protruded electrodes are rendered uniform in height after the formation of said protruded electrodes.

3. A method according to claim 1, wherein said sealing resin forming step is executed using a mold having convex portions corresponding to said concave portions.

4. A method according to claim 3, wherein the heights of the surfaces of said protruded electrodes are made uniform by said mold before said elements are resin-sealed by the mold.

5. A method according to claim 1, wherein said each protruded electrode is formed by plating.

6. A method according to claim 1, wherein said concave portions are grooves defined along said plurality of element regions to be divided into said plurality of elements.

7. A method of manufacturing a semiconductor device, comprising the steps of:

forming protruded electrodes in a plurality of element regions of a wafer having said plurality of element regions formed on the surface thereof;

forming a sealing resin having concave portions provided on the surface of said wafer, said surface including surfaces of said protruded electrodes, said concave portions extending to the neighborhood of the surface of said wafer and defining boundaries among said plurality of element regions;

polishing the sealing resin until the surfaces of said protruded electrodes are exposed;

forming ball electrodes on the protruded electrodes exposed from said sealing resin respectively; and dividing said plurality of element regions into individual elements with said concave portions as standards.

8. A method of manufacturing a semiconductor device, comprising the steps of:

respectively forming protruded electrodes in a plurality of element regions of a wafer having said plurality of element regions provided on a surface thereof;

applying said wafer to a scribe sheet and thereafter dividing said plurality of element regions into individual elements;

forming a sealing resin on said wafer surface including gaps between said adjacent respective divided elements in a state in which said protruded electrodes are being exposed;

forming ball electrodes on the protruded electrodes exposed from the sealing resin; and dividing said elements into individual fractions in a state in which the resin on each element side, of the sealing resin formed within the gaps between the respective elements is being left behind.

9. A method according to claim 8, wherein said dividing step before forming the sealing resin is executed by a first blade relatively broad in width and said dividing step after forming the sealing resin is executed by a second blade relatively narrow in width.

10. A method according to claim 9, wherein the width of said f first blade is substantially twice the width of said second blade.

11. A method of manufacturing a semiconductor device, comprising the steps of:

respectively forming protruded electrodes in a plurality of element regions of a wafer having said plurality of element regions formed on a surface thereof;

applying said wafer to a scribe sheet and thereafter dividing said plurality of element regions into elements;

elongating the scribe sheet to widen intervals between said respective divided elements;

forming a sealing resin on said wafer surface including the intervals between said respective widened elements in a state in which said protruded electrodes are being exposed;

forming ball electrodes on the protruded electrodes exposed from the sealing resin respectively; and dividing the elements into individual fractions in a state in which the resin on each element side, of the sealing resin formed within the gap between the adjacent elements is being left behind.

\* \* \* \* \*